United States Patent

[11] 3,585,333

[72] Inventors Louis J. Valle
Ardsley on Hudson, N.Y.;
Otto Hoegerl, Saegerstown, Pa.
[21] Appl. No. 837,484
[22] Filed June 30, 1969
[45] Patented June 15, 1971
[73] Assignee National Tel-Tronics Corporation
Yonkers, N.Y.

[54] RAPID ASSEMBLY CLIP FOR MOUNTING COMPONENTS ON AN ELECTRONIC CHASSIS
4 Claims, 6 Drawing Figs.

[52] U.S. Cl. .......... 200/168, 317/101
[51] Int. Cl. .......... H01h 9/02
[50] Field of Search .......... 317/101 (CC); 248/222; 287/189.35, 189.36 (D), 20.92 (J); 52/285; 200/168 (A)

[56] References Cited

UNITED STATES PATENTS

| | | | |
|---|---|---|---|
| 2,328,757 | 9/1943 | Tinnerman | 287/189.35 (X) |
| 2,959,896 | 11/1960 | Schneller | 52/285 |
| 3,066,367 | 12/1962 | Garman | 317/101 (CC) (UX) |
| 3,308,590 | 3/1967 | Ettore et al. | 52/285 (X) |
| 3,340,440 | 9/1967 | Minter | 317/101 (CC) |
| 3,346,282 | 10/1967 | Yarborough | 52/285 (X) |

FOREIGN PATENTS

| | | | |
|---|---|---|---|
| 726,196 | 3/1955 | Great Britain | 287/189.35 |

*Primary Examiner*—H. O. Jones
*Attorney*—Charles E. Temko

ABSTRACT: A stamped resilient clip for mounting planar electronic components at an angle with respect to the principal horizontal plane of an electronic chassis. The clip includes a base wall having a resilient tab selectively projectable through a first opening in said chassis, and resiliently engaging a second adjacent opening therein, and a second wall angularly disposed with respect to said first wall upon which the component is mounted.

PATENTED JUN 15 1971 3,585,333

RAPID ASSEMBLY CLIP FOR MOUNTING COMPONENTS ON AN ELECTRONIC CHASSIS

This invention relates generally to the field of electronic hardware, and more particularly to an improved resilient clip for mounting components upon a chassis.

As is well known in the art, electronic chassis are normally formed as metallic stampings, and include a principal horizontal wall upon which individual components may be mounted for interconnection. In the case of certain components of a relatively bulky or heavy nature, such as terminal boards, it has been customary to secure the same by angularly shaped brackets which are bolted or eyeleted to both the terminal board and the chassis. This process is time consuming, and prohibits rapid assembly of components on a production line, and precludes the ready replacement of a terminal board should this become necessary or desirable at some time subsequent to assembly.

It is therefore among the principal objects of the present invention to provide an improved clip permitting rapid assembly of such components as planar terminal boards upon an electronic chassis, this assembly normally being performed without the use of any tools, and with increased facility.

Another object of the invention lies in the provision of an improved clip of the class described which may be fabricated as a simple stamping from resilient metallic material, whereby the same may be manufactured at a reasonably low cost, directly comparable with existing, prior art devices.

Yet another object of the invention lies in the provision of an improved rapid assembly clip which will be capable of maintaining itself in installed condition irrespective of the presence of vibration, shock or angular position imparted to the chassis.

A feature of the disclosed embodiment lies in the fact that it may be employed to replace existing types of hardware without any substantial modification of the components which it interconnects.

These objects and feature, as well as other incidental ends and advantages, will more fully appear in the progress of the following disclosure, and be pointed out in the appended claims.

In the drawing, to which reference will be made in the specification, similar reference characters have been employed to designate corresponding parts throughout the several views.

Figure 1:
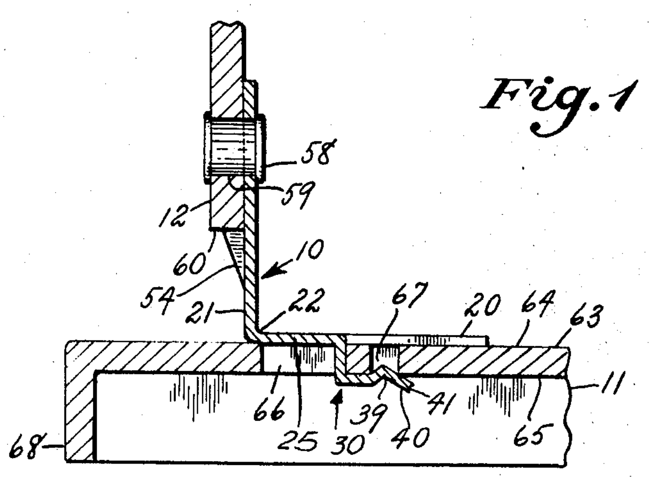
FIG. 1 is a fragmentary sectional view of an embodiment of the invention as seen from the plane 1–1 in FIG. 2.
Figure 2:
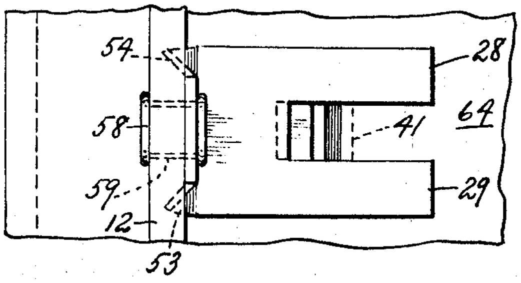
FIG. 2 is a fragmentary plan view of the embodiment.

In accordance with the invention, the device, generally indicated by reference character 10, is illustrated in FIGS. 1 and 2 of the drawing in interconnected condition with respect to a conventional electronic chassis 11 supporting a typical electronic component, such as a vertically oriented terminal board 12.

The device 10, as has been mentioned, is preferably formed as a unitary stamping from resilient sheet metal, and comprises broadly a first or base wall 20, and a second or vertical wall 21, the walls 20—21 being interconnected at ends thereof by a bend portion 22.

The base wall 20 is of generally rectangular configuration, and is bounded by an upper surface 24, a lower surface 25, side edges 26 and 27 and end edges 28 and 29. Extending downwardly from the lower surface 25 is a resilient locking tab 30, also of generally rectangular configuration, and formed from the material disposed medially of parallel inner edges 31 and 32. The tab 30 includes a first bend portion 33 interconnecting a downwardly extending vertical portion 34. A second bend portion 35 interconnects a horizontal portion 36, in turn interconnected by a third bend portion 37 to a first angularly disposed portion 38. The portion 38 interconnects with a substantially right angular bend portion 39 interconnecting a downwardly extending angularly disposed camming portion 40 having a free terminal edge 41.

The second or vertical wall 21 is bounded by an inner surface 44, and an outer surface 45. Lower side edges 46 and 47 extend upwardly from the bend portion 22 to a pair of short horizontal edges 48 and 49, in turn communicating with upper side edges 50 and 51 both of which terminate at a top edge 52. The corners formed by the interconnection of the edges 46 and 47 with the edges 48 and 49, respectively, are outwardly bent from the outer surface 45 to form corner tabs 53 and 54 whereby the horizontal edges 48 and 49 form aligning means for engaging the edge of a mounted component. An opening 55 is medially disposed between the edges 50 and 51.

Referring to FIGS. 1 and 2, a fastener 58 is employed to mount the terminal board 12, the same penetrating a corresponding opening 59 therein. Where the board 12 is of considerable size, a pair of devices 10 may be employed, in which case a lower edge 60 is aligned by engagement with the edges 48—49 of each device 10.

The conventional chassis 11 illustrated in FIGS. 1 and 2 includes a horizontally disposed wall 63 having an upper surface 64 and a lower surface 65. To permit engagement of the device 10 therewith, there is provided a first generally rectangular opening 66 the dimensions of which are sufficiently large to permit entry of the tab 30 therethrough, and a second rectangular opening 67 adapted to engage the bend portion 39. Installation is accomplished by inserting the terminal edge 41 of the tab 30 through the first opening, to a point where the lower surface of the first wall 20 overlies the upper surface 64, following which the device 10 is moved in a direction toward the second opening 67, whereby the angularly disposed camming portion 40 is moved downwardly to a point where the bend 39 snaps into position. Removal of the device from engagement with the chassis is accomplished by a reverse motion.

Where desired, the clip may also be installed on a vertically disposed wall 68, depending upon individual requirements.

Figure 6:
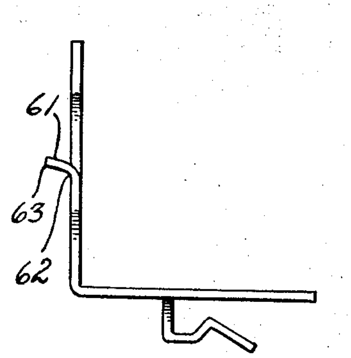
FIG. 6 is a side elevational view similar to that shown in FIG. 4 showing an alternate form of the embodiment.
Figure 3:
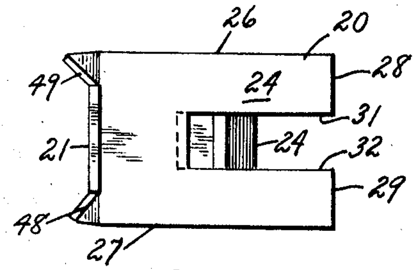
FIG. 3 is a plan view of the embodiment in detached condition with respect to an electronic chassis and mounted component.
Figure 4:
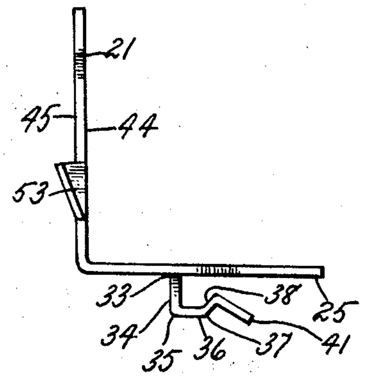
FIG. 4 is a side elevational view thereof in similar condition.
Figure 5:
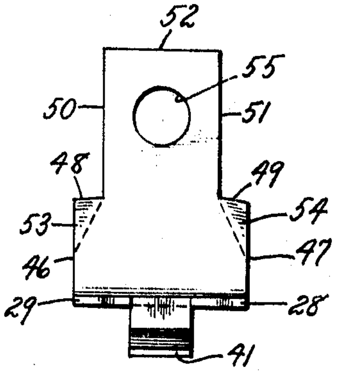
FIG. 5 is an end elevational view thereof as seen from the left-hand portion of FIG. 4.

In the alternate form of the embodiment illustrated in FIG. 6, the tabs 53 and 54 are replaced by right angle bent prongs 63 which more fully support the board 12 by providing a flat surface 61 rather than edges 49 and 48. The prongs 63 are formed by providing right angle bends at 52 whereby the same may extend outwardly at right angles with respect to the plane of the vertical wall 21.

We wish it to be understood that we do not consider the invention limited to the precise details of structure shown and set forth in this specification, for obvious modifications will occur to those skilled in the art to which the invention pertains.

We claim:

1. A rapid assembly clip comprising a unitary resilient metallic stamping having a first planar wall, a second planar wall extending at right angles with respect to said first wall, and a bend portion interconnecting said first and second walls; said first wall having a resilient locking tab extending outwardly from an outer surface thereof, said locking tab having a principal axis extending parallel to the plane of said first wall and having a locking projection extending toward said outer surface, said locking tab having a camming surface adjacent said projection terminating in a free edge; said second wall having a through opening therein, said opening having a principal axis substantially parallel to that of said locking tab.

2. Structure in accordance with claim 1 in combination with an electronic chassis and a component mounted upon said chassis, said chassis having a wall, there being first and second adjacent openings therein, said locking tab extending through said first opening and resiliently engaging said second opening to form detent means thereat.

3. Structure in accordance with claim 1, further characterized in the provision of a pair of tabs bent outwardly from the plane of the second wall, and a through opening extending through the plane of the second wall, to provide means for mounting a generally planar electronic component.

4. Structure in accordance with claim 3, in which said tabs are disposed at a right angle with respect to said second wall.